United States Patent
Simmons et al.

(10) Patent No.: US 7,145,157 B2
(45) Date of Patent: Dec. 5, 2006

(54) KINEMATIC ION IMPLANTER ELECTRODE MOUNTING

(75) Inventors: Jonathon Y. Simmons, San Jose, CA (US); John R. Shelley, Charlwood (GB); Andrew Stephen Devaney, Slinfold (GB)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 10/688,076

(22) Filed: Oct. 17, 2003

(65) Prior Publication Data

US 2005/0056794 A1    Mar. 17, 2005

Related U.S. Application Data

(63) Continuation-in-part of application No. 10/661,027, filed on Sep. 11, 2003.

(51) Int. Cl.
*G21K 5/10* (2006.01)

(52) U.S. Cl. .............. 250/492.21; 250/492.2; 250/492.3

(58) Field of Classification Search ........... 250/492.21, 250/492.2, 492.3
See application file for complete search history.

(56) References Cited

U.S. PATENT DOCUMENTS

| | | | |
|---|---|---|---|
| 4,135,305 A | | 1/1979 | Krause |
| 4,765,741 A | | 8/1988 | Detro et al. |
| 5,219,376 A | | 6/1993 | Vinohradsky |
| 5,296,713 A | | 3/1994 | Tanaka et al. |
| 5,420,415 A | * | 5/1995 | Trueira ............ 250/492.21 |
| 5,523,652 A | * | 6/1996 | Sferlazzo et al. ........ 315/111.41 |
| 5,554,852 A | | 9/1996 | Bright et al. |
| 5,554,854 A | * | 9/1996 | Blake .................. 250/492.21 |
| 5,763,890 A | * | 6/1998 | Cloutier et al. .............. 250/427 |
| 5,821,764 A | | 10/1998 | Slocum et al. |

(Continued)

FOREIGN PATENT DOCUMENTS

EP       0135366       3/1985

(Continued)

OTHER PUBLICATIONS www.newport.com web page dated May 21, 2003, "Selecting an Optical Mount," 1 pg.

(Continued)

*Primary Examiner*—Nikita Wells
*Assistant Examiner*—Anthony Quash
(74) *Attorney, Agent, or Firm*—Konrad Raynes Victor & Manning

(57) ABSTRACT

A kinematic electrode mount is provided for an ion implanter in which an electrode insert member having an electrode body portion which defines an aperture, is inserted into an electrode support frame. In one embodiment, a first kinematic alignment pin of the insert member engages a first, groove-shaped kinematic alignment surface of the electrode support frame to align the first alignment pin in two orthogonal directions relative to the electrode support frame. In addition, a second kinematic alignment pin of the insert member engages a second kinematic alignment surface of the electrode support frame to align the insert member in a rotational orientation relative to the electrode support frame. A plurality of flanges of the insert member engage the electrode support frame to retain the insert member in the aligned position and to electrically couple the electrode insert member to the electrode support frame. A spring positioned between the electrode insert member and the electrode support frame biases the electrode insert member in the aligned and retained position relative to the electrode support frame. In another embodiment, the electrode support frame has alignment pins and the insert member has alignment slots.

36 Claims, 9 Drawing Sheets

U.S. PATENT DOCUMENTS

| | | | |
|---|---|---|---|
| 5,932,882 A | 8/1999 | England et al. | |
| 5,944,194 A | 8/1999 | Gregerson et al. | |
| 5,959,396 A * | 9/1999 | Moreshead et al. | 313/363.1 |
| 6,079,355 A * | 6/2000 | Lou et al. | 118/723 E |
| 6,164,664 A | 12/2000 | Fosnight et al. | |
| 6,165,268 A | 12/2000 | Ow et al. | |
| 6,326,579 B1 | 12/2001 | Krawczyk et al. | |
| 6,419,438 B1 | 7/2002 | Rosenquist | |
| 6,423,976 B1 | 7/2002 | Glavish et al. | |
| 6,550,126 B1 | 4/2003 | Szettella et al. | |
| 6,556,032 B1 | 4/2003 | Uher et al. | |
| 6,574,053 B1 | 6/2003 | Spinali | |
| 2002/0122178 A1 | 9/2002 | McMurtry et al. | |
| 2003/0076602 A1 | 4/2003 | Nishikawa | |
| 2003/0197129 A1* | 10/2003 | Murrell et al. | 250/423 R |

FOREIGN PATENT DOCUMENTS

| | | |
|---|---|---|
| EP | 0845799 | 6/1998 |
| GB | 2149877 | 6/1985 |
| GB | 2239894 | 7/1991 |
| JP | 2001210590 | 8/2001 |
| WO | 01043157 | 6/2001 |

OTHER PUBLICATIONS www.mellesgriot.com web page (dated prior to Sep. 11, 2003), "Kinematic Mirror/Beamsplitter Mounts," 2 pp.

Furman, B.J., "Kinematic Design Principles," Sep. 24, 1997, 9 pp.

Schricker, Alexander, "Kinematic Mounts for Alignment Bars," ATLAS Muon Note xxx dated Oct. 15, 2001; 8 pp.

PCT/US2004/034457 International Search Report & Written Opinion mailed Apr. 29, 2005.

* cited by examiner

KINEMATIC ION IMPLANTER ELECTRODE MOUNTING

RELATED APPLICATIONS

This application is a continuation-in-part application of parent application entitled "Kinematic Ion Implanter Electrode Mounting," Ser. No. 10/661,027, filed Sep. 11, 2003, and assigned to the assignee of the present application.

FIELD OF THE INVENTION

This invention relates to ion implanters for implanting ions into substrates, such as semiconductor wafers, in electronic device fabrication, and in particular to ion implanters capable of processing wafers on a commercial scale.

BACKGROUND

Ion implantation techniques are commonly used as one of the processes employed in the manufacture of integrated circuits, to modify the electrical transport properties in predefined regions of a semiconductor material by doping these regions with a predetermined concentration of impurity atoms. The technique generally involves generating a beam of a preselected specie of ions and directing the beam towards a target substrate. The depth of the ion implant depends, inter alia, on the energy of the ion beam at the substrate. As the density of devices on a single wafer increases and the lateral dimensions of individual devices decrease for ultra-large scale integrated circuits (ULSI), the ability of an ion implanter to form shallow junctions using low energy ions, e.g. of about 0.2 keV to 10 keV, becomes increasingly useful. At the same time, in commercial ion implantation, it is often also useful to be able to process an individual wafer in as short a time as possible and this requires the ion beam current to be as large as possible.

U.S. Pat. No. 5,932,882 describes one prior technique in which an ion beam is transported at high energy and then decelerated to a lower energy just before the beam impacts the substrate. The ion implanter of this reference comprises an ion beam generator which includes a source of ions and an extractor electrode assembly for extracting the ions from the source and forming a beam of ions. The extraction electrode assembly comprises one or more electrodes which typically have apertures through which the ion beam is shaped. A flight tube transports the beam from the extraction assembly at a transport energy, and a substrate holder holds a substrate to be implanted with beam ions. A deceleration potential generator connected to apply a deceleration potential to a deceleration lens assembly between the flight tube and the substrate holder decelerates beam ions to a desired implant energy. The deceleration lens assembly located between the flight tube and the substrate holder comprises a plurality of electrodes which typically have apertures through which the ion beam passes.

The positioning of electrodes such as the extraction electrodes relative to the other parts of the ion implanter can affect the characteristics of the ion beam including beam energy, beam size and beam shape. To align the extraction electrodes of the ion implanter, various devices have been proposed. For example, special set up tools or jigs have been used to align the electrodes for installation into the extraction electrode assembly. These set up tools have often included dowels or other alignment surfaces which are received in corresponding alignment apertures of the electrodes. Each electrode upon being aligned using the setup tool is typically fastened in place within the extraction electrode assembly using suitable fasteners such as screw fasteners. The setup tool is then removed from the extraction electrode assembly. This procedure is typically repeated each time the electrode is replaced.

SUMMARY OF ILLUSTRATED EMBODIMENTS

A kinematic electrode mount is provided for an ion implanter in which an electrode insert member having an electrode body portion which defines an aperture, is inserted into an electrode support frame. In one embodiment, a first kinematic alignment pin of the insert member engages a first, groove-shaped kinematic alignment surface of the electrode support frame to align the first alignment pin in two orthogonal directions relative to the electrode support frame. In addition, a second kinematic alignment pin of the insert member engages a second kinematic alignment surface of the electrode support frame to align the insert member in a rotational orientation relative to the electrode support frame. A plurality of flanges of the insert member engage the electrode support frame to retain the insert member in the aligned position and to electrically couple the electrode insert member to the electrode support frame. A spring positioned between the electrode insert member and the electrode support frame biases the electrode insert member in the aligned and retained position relative to the electrode support frame.

There are additional aspects to the present inventions. For example, the electrode insert member may have alignment surfaces and the electrode support frame may have alignment pins which engage the alignment surfaces. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

Examples of embodiments of the present invention will now be described with reference to the drawings in which.

DESCRIPTION OF ILLUSTRATED EMBODIMENTS

Figure 1:
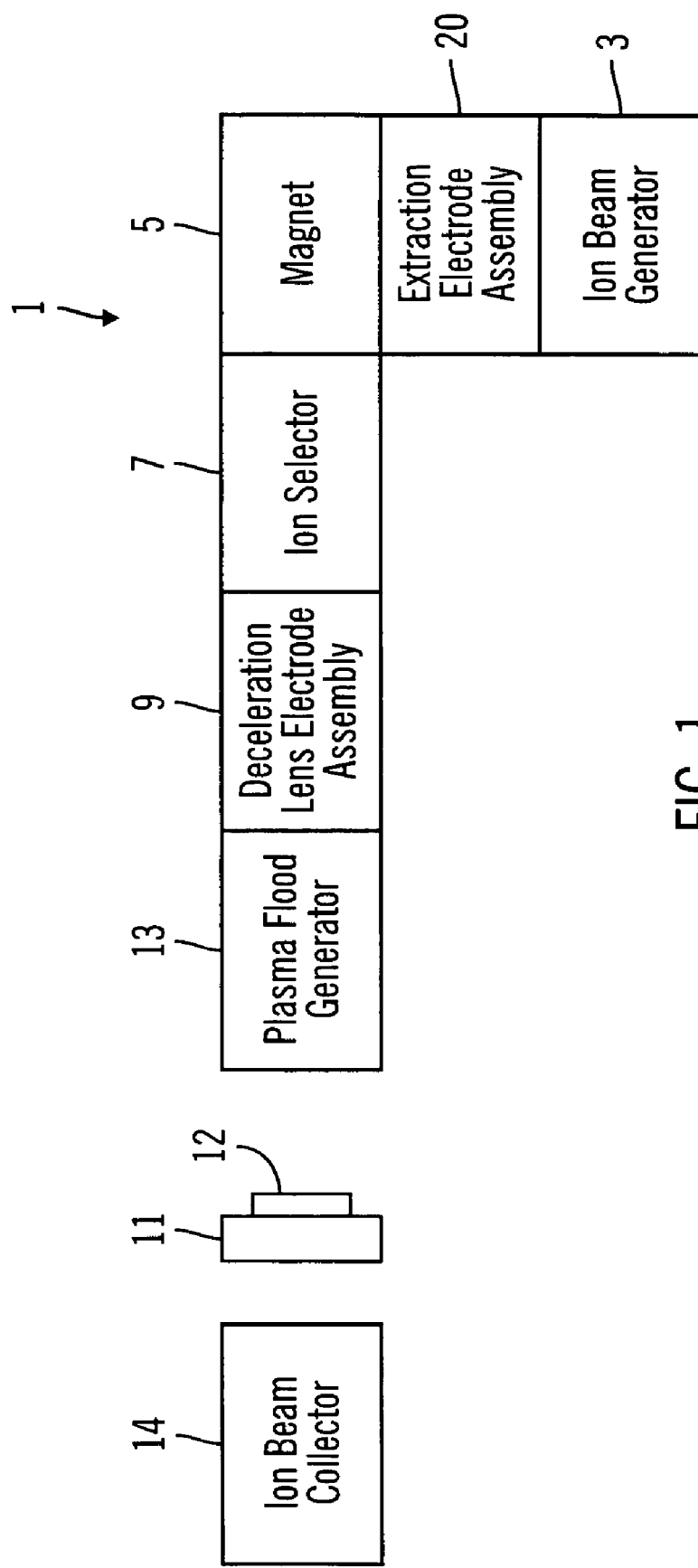
FIG. 1 shows a schematic diagram of an ion implanter employing a kinematic electrode mount according to an embodiment of the present invention.

An ion implanter in accordance with one embodiment is indicated generally at 1 in FIG. 1. The ion implanter 1 comprises an ion beam generator 3 for generating a beam of ions. A magnet 5 adjacent the ion beam generator spatially resolves the beam ions according to their mass and charge state. An ion selector 7 disposed adjacent the analyzing magnet 5 selects a specie of ions to be implanted into a target substrate and rejects other ions in the spatially resolved beam from the magnet. A deceleration lens electrode assembly 9 disposed adjacent the ion selector 7 controls the final energy of the ion beam before implantation. A support or holder 11 spaced from the electrode assembly 9 supports a target substrate 12 to be implanted with beam ions. A plasma generator 13 disposed between the electrode assembly 9 and the substrate support 11 introduces electrons and other charged particles into the ion beam near the target surface to neutralize the beam and wafer surface. An ion beam collector 14 positioned downstream of the substrate support 11 serves as a beam stop and ion current detector for dosimetry measurements.

In more detail, the plasma generator 3 of the illustrated embodiment comprises an ion source including an arc chamber having an exit aperture. An extraction electrode assembly 20 includes a plurality of extraction electrodes (such as two, three, or four, for example) which are spaced from the exit aperture. The extraction electrodes of the assembly 20 extract ions from the arc chamber and form an ion beam. The extraction electrodes may be made of graphite or other suitable conductive material. The extraction electrode which is closest to the exit aperture of the arc chamber serves as a suppression electrode to prevent electrons forward of the beam generator from flowing to the arc chamber. As explained in greater detail below, the extraction electrode assembly 20 includes a kinematic mount which permits each electrode to be readily mounted in place in a closely controlled aligned position without the need for realignment each time an electrode aperture is replaced. Although described principally in connection with the extraction electrodes, it is appreciated that a kinematic mount in accordance with these embodiments may be used to mount other electrodes of an ion implanter including the deceleration electrodes of the electrode assembly 9 discussed below.

A flight tube positioned between poles of the mass analyzing magnet 5, receives the ion beam from the beam generator 3 and controls the transport energy of the ion beam during its passage between the poles of the magnet 5. The transport energy of the ion beam is a function of the potential difference between the flight tube and the ion source. In this particular embodiment, the magnetic field strength of the analyzing magnet and the energy of the ion beam through the magnet are chosen so that ions having an appropriate mass and charge state are deflected through approximately 90 degrees for passage through the ion selector 7, the electrode assembly 9 and the plasma generator 13 to the surface of the wafer.

Figure 2:
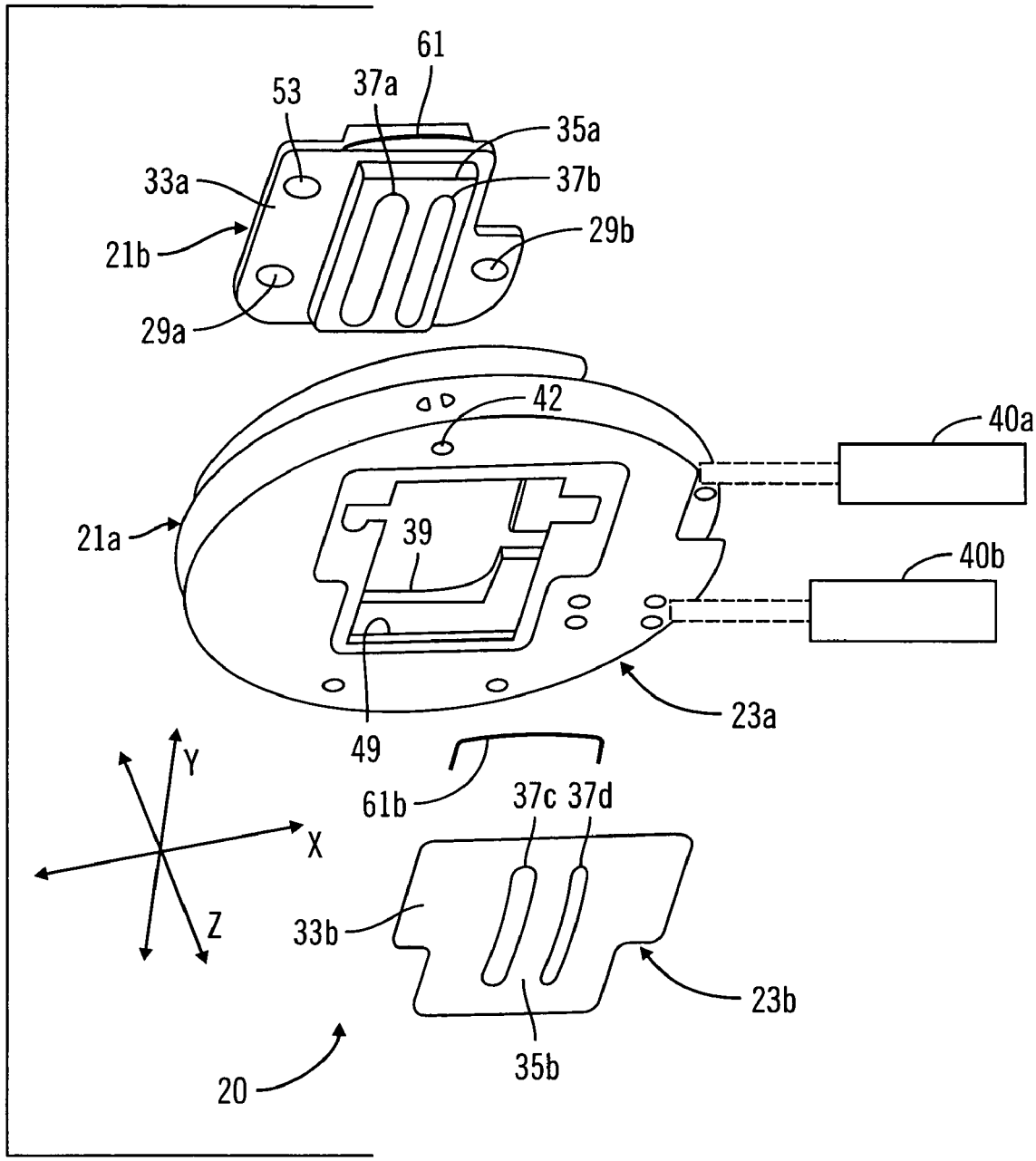
FIG. 2 shows an exploded view of kinematic electrode mounts in accordance with various embodiments.
Figure 3:
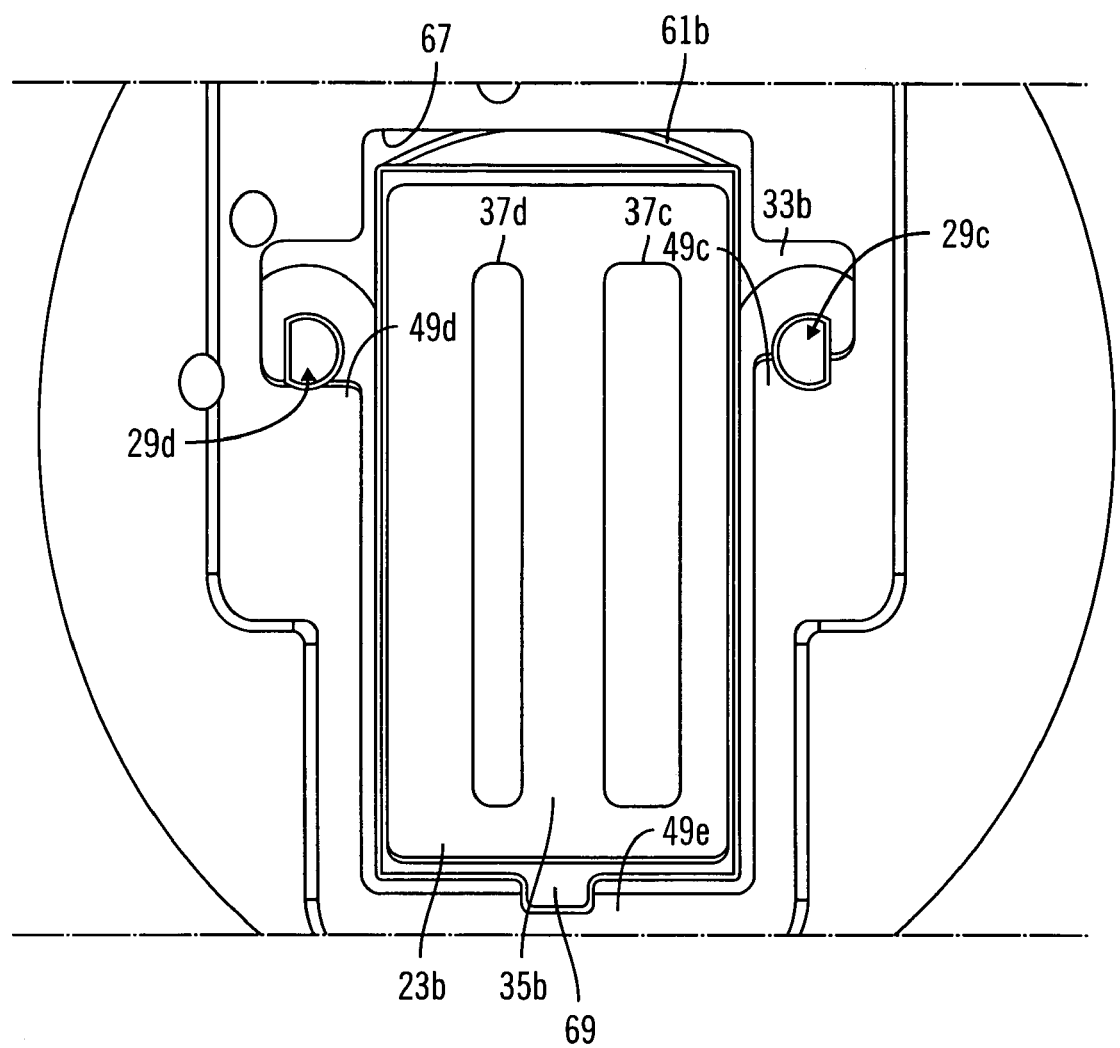
FIG. 3 shows a plan view of one embodiment of a kinematic electrode mount of FIG. 2.
Figure 4:
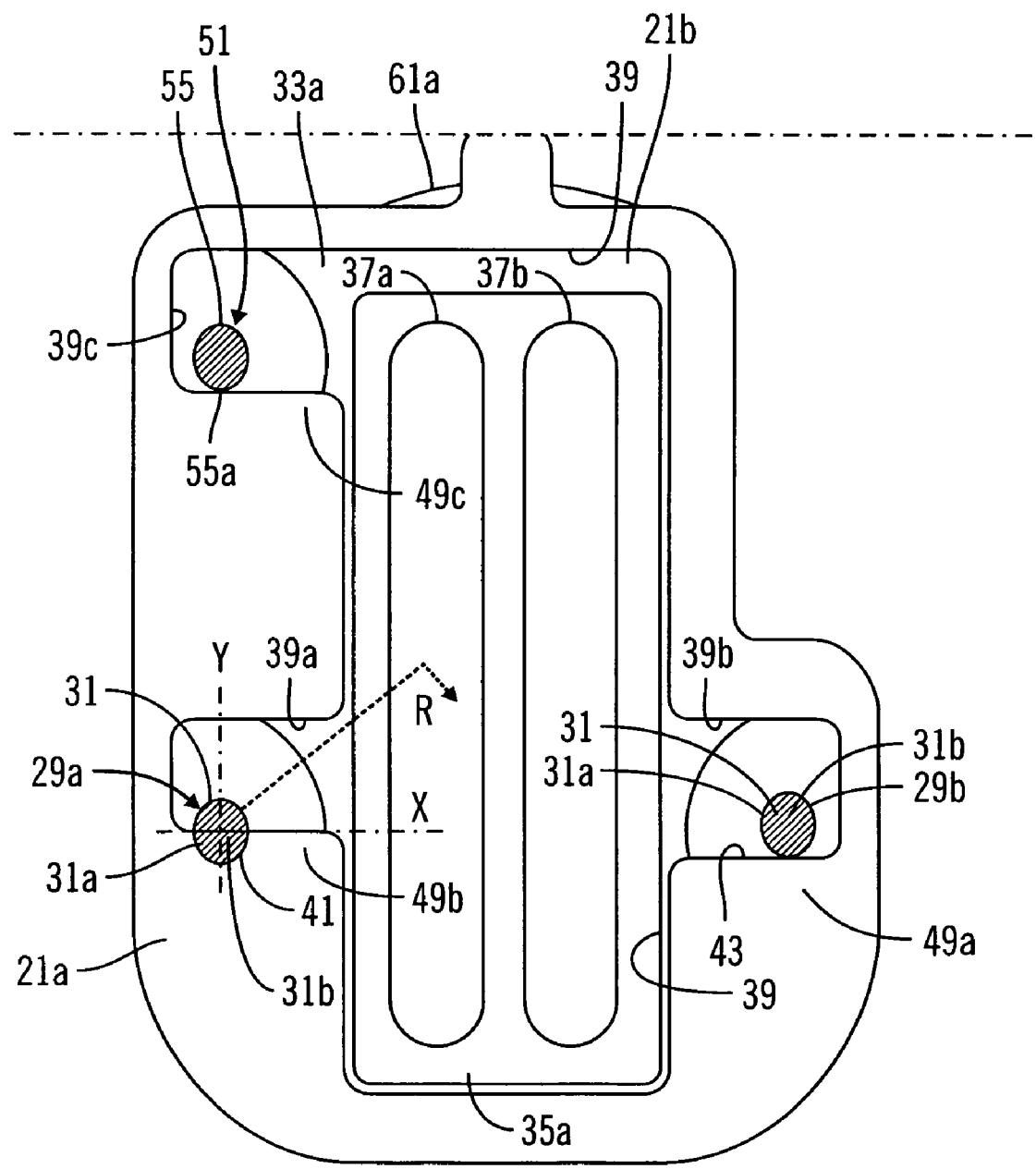
FIG. 4 shows a cross-sectional view of another embodiment of a kinematic electrode mount of FIG. 2.

The extraction electrode assembly 20 is shown partially unassembled in FIG. 2. one extractor electrode includes an electrically conductive mounting or support frame component 21a and an electrically conductive insert member component 21b which is inserted into and mounted to the support frame component 21a. In a similar fashion, another extraction electrode includes a support frame component 23a and an insert member component 23b which is inserted into and mounted to the support frame component 23a. In accordance with one aspect of the illustrated embodiments, each insert member component 21b, 23b has a plurality of kinematic alignment pins 29a, 29b (FIG. 2) and 29c, 29d (FIG. 3), respectively. As best seen in the cross-sectional assembly drawing of FIG. 4, the kinematic alignment pins 29a and 29b of the insert member component 21b each have a generally cylindrical body portion 31. In a similar manner, the kinematic alignment pins 29c and 29d of the insert member component 23b each have a generally cylindrical body portion 31 as best seen in the cross-sectional assembly drawing of FIG. 5.

The insert member component 21b has a plate portion 33a from which the kinematic alignment pins 29a, 29b extend. Also extending from the plate portion 33a is an extraction electrode body portion 35a which defines a pair of ion beam extraction slots 37a, 37b. When mounted to the support frame component 21a, the extraction electrode body portion 35a extends through a central aperture 39 of the support frame component 21a. Similarly, the insert member component 23b has a plate portion 33b from which the kinematic alignment pins 29c, 29d extend. Also extending from the plate portion 33b is an extraction electrode body portion 35b which defines a pair of ion beam extraction slots 37c, 37d. When mounted to the support frame component 23a, the extraction electrode body portion 35b extends through a central aperture 67 of the support frame component 21a.

The support frame components 21a and 23a are first aligned within the ion implanter 1 and then fastened to suitable mounts indicated schematically at 40a, 40b, respectively in FIG. 2. In some applications, the mounts 40a, 40b include actuators which can move the extraction electrodes 21, 23 such that the ion beam passes through either one set of extraction electrode apertures 37a, 37c or the other set of extraction electrode apertures 37b, 37d, depending upon the application. The support frame components 21a, 23a may be aligned using a suitable alignment jig or tool which has alignment pins which engage appropriate alignment apertures such as an aperture 42 of the support frame component 21a and appropriate apertures in the electrode mount 40b. Once the support frame components 21a, 23a are aligned with respect to the mounts 40a, 40b, the support frame components 21a, 23a are fastened to the mounts 40a, 40b using suitable fasteners such as screw fasteners. The alignment jib is removed from the ion implanter 1 once the extraction electrode support frame components 21a, 23a are aligned and installed in the ion implanter.

It is anticipated that the useful lifetime of the support frame components 21a, 23a will be relatively long as compared to the insert member components 21b, 23b. Accordingly, replacement and alignment of the support frame components 21a, 23a using an alignment jig may be relatively infrequent.

To kinematically mount the insert member component 21b into a previously aligned support frame component 21a, the kinematic alignment pin 29a of the insert member component 21b is received in a kinematic groove 41 (FIG. 4) defined by a slot 39a of the support frame component 21a. When the outer cylindrical surface 31a of the kinematic alignment pin 29a is fully engaged with the surfaces of the kinematic groove 41, the center axis 31b is precisely located in two orthogonal directions relative to the support frame component 21 a as represented by the x and y axes of the support frame component 21a of FIG. 4.

The insert member component 21b is then rotated, pivoting on the axis 31b of the pin 29a until the second kinematic alignment pin 29b of the insert member component 21b engages a flat kinematic alignment surface 43 defined by a slot 39b of the support frame component 21a. When the outer cylindrical surface 31a of the kinematic alignment pin 29b is fully engaged with the flat kinematic alignment surface 43, the center axis 31b of the kinematic alignment pin 29b is precisely located in a rotational direction relative to the support frame component 21a as represented by rotation axis R of the support frame component 21a of FIG. 4. Because the alignment surface 43 is not a groove like the alignment groove 41, the engagement of the pin 29b with the alignment surface 43 does not interfere with the engagement of the alignment pin 29a with the alignment groove 41.

Figure 6:
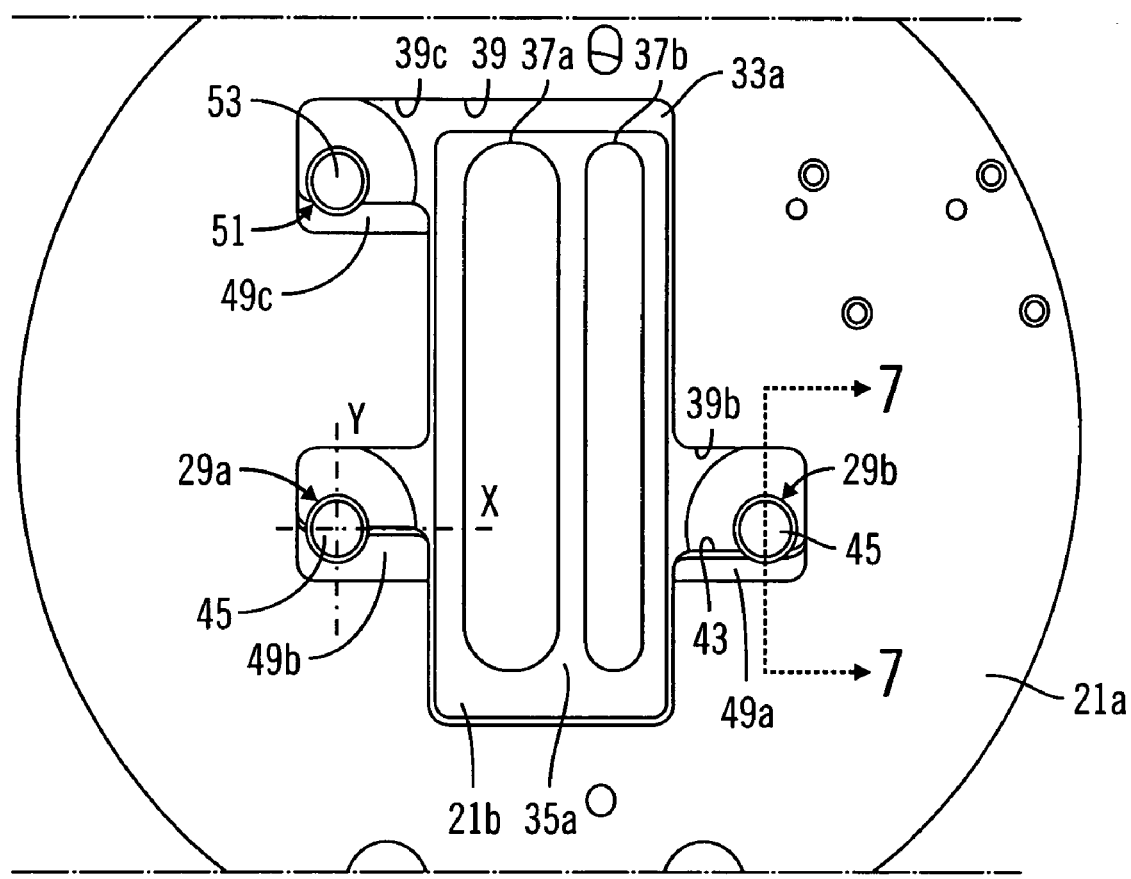
FIG. 6 shows a plan view of the kinematic electrode mount of FIG. 4.
Figure 7:
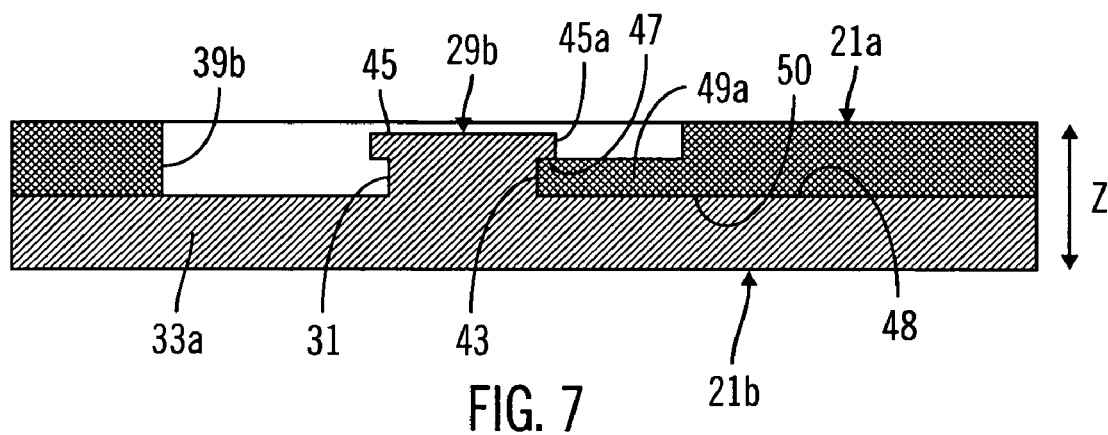
FIG. 7 is a cross-sectional view of an alignment pin of the kinematic electrode mount of FIG. 6 as shown along the lines 7—7 of FIG. 6.

As shown in FIG. 6, the kinematic alignment pins 29a, 29b each have retainer caps 45 at the ends of the cylindrical body portions 31. As best seen in FIG. 7, the retainer caps 45 are wider in width than the body portions 31 of the kinematic alignment pins such that the caps 45 overhang the pin body portions 31 to provide a retention flange 45a. The cap retention flange 45a and body portion 31 of each alignment pin together with the opposing adjacent surface of the insert member plate portion 33b forms a retainer groove 47 which receives a tongue portion of the support frame component 21a. The inner retention surfaces of the groove 47 engages the outer retention surfaces of the tongue portion to secure the insert member plate portion 33b to the support frame component 21a in the third orthogonal direction as represented by the Z axis of the support frame component 21a of FIGs. 4 and 7. For example, the retainer groove 47 of the alignment pin 29b receives a tongue portion 49a of the support frame component 21a. The leading edge of the support frame tongue portion 49a provides the kinematic alignment surface 43 engaged by the outer cylindrical surface 31a of the kinematic alignment pin 29b. In this position, a flat face portion 48 of the insert member plate portion 33a is engaged face to face with a flat face portion 50 of the support frame 21a. In addition to being located and retained in the Z direction relative to the support frame component 21a, the insert member component 21b also makes electrical contact with the support frame component 21a in this engaged position.

In a similar fashion, the retainer groove 47 of the kinematic alignment pin 29a receives a tongue portion 49b (FIG. 6) of the support frame component 21a to secure the insert member plate portion 33b to the support frame component 21a in the Z direction of FIGs. 2 and 7. The leading edges (FIG. 4) of the support frame tongue portion 49b provides the kinematic alignment groove 41 engaged by the outer cylindrical surface 31a of the kinematic alignment pin 29a.

In the illustrated embodiment, the insert member component 21b has an additional pin 51 which has an overhanging retainer cap 53 at the end of a generally cylindrical body portion 55 (FIG. 4) to form a retainer groove which receives a tongue portion 49c of the support frame component 21a. The pin 51 acts to further secure the insert member plate portion 33b to the support frame component 21a in the Z direction of the support frame component 21a of FIG. 2. The body portion 55 has a relieved portion 55a to provide clearance between the outer surface of the pin body portion 55 so that the pin 51 does not interfere with the kinematic seating of the kinematic alignment pins 29a, 29b.

The slots 39a, 39b, and 39c of the support frame component 21a are each sized sufficiently to admit the caps 45, 53 of the pins 29a, 29b, 51 into the associated slot 39a–39c. In addition, the central aperture 39 is sized sufficiently to admit the extraction electrode body portion 35a into the aperture 39. The insert member component 21b is then pushed downward (-Y direction of FIG. 6) until the kinematic alignment pins 29a, 29b engage the kinematic alignment groove 41 and kinematic alignment surface 43, respectively, as discussed above. The insert member component 21bhas a spring 61a (FIG. 4 ) which engages the support frame component 21a to prevent accidental displacement of the insert member component 21b from the kinematic engagement positions.

The insert component 23b is kinematically mounted to the support frame component 23a in a similar fashion. Thus, the insert member component 23b has a plate portion 33b from which the kinematic alignment pins 29c, 29d extend. Also extending from the plate portion 33b is an extraction electrode body portion 35b which defines a pair of ion beam extraction slots 37c, 37d. When mounted to the support frame component 23a, the extraction electrode body portion 35b extends through a central aperture 67 of the support frame component 23a To kinematically mount the insert member component 23b into a support frame component 23awhich has previously been aligned using an alignment tool as described above in connection with the support frame component 21a, the kinematic alignment pin 29c of the insert member component 23b is received in a kinematic groove 41 (FIG. 5) defined by a slot 67a of the support frame component 23a. When the outer cylindrical surface 31a of the kinematic alignment pin 29c is fully engaged with the surfaces of the kinematic groove 41, the center axis 31b is precisely located in two orthogonal directions relative to the support frame component 23a as represented by the x and y axes of the support frame component 23a of FIG. 5.

The second kinematic alignment pin 29d of the insert member component 23b is then rotated until it engages a flat kinematic alignment surface 43 defined by a slot 67b of the support frame component 23a. When the outer cylindrical surface 31a of the kinematic alignment pin 29d is fully engaged with the flat kinematic alignment surface 43, the center axis 31b of the kinematic alignment pin 29d is precisely located in a rotational direction relative to the support frame component 23a as represented by rotation axis r of the support frame component 23a of FIG. 5.

Figure 5:
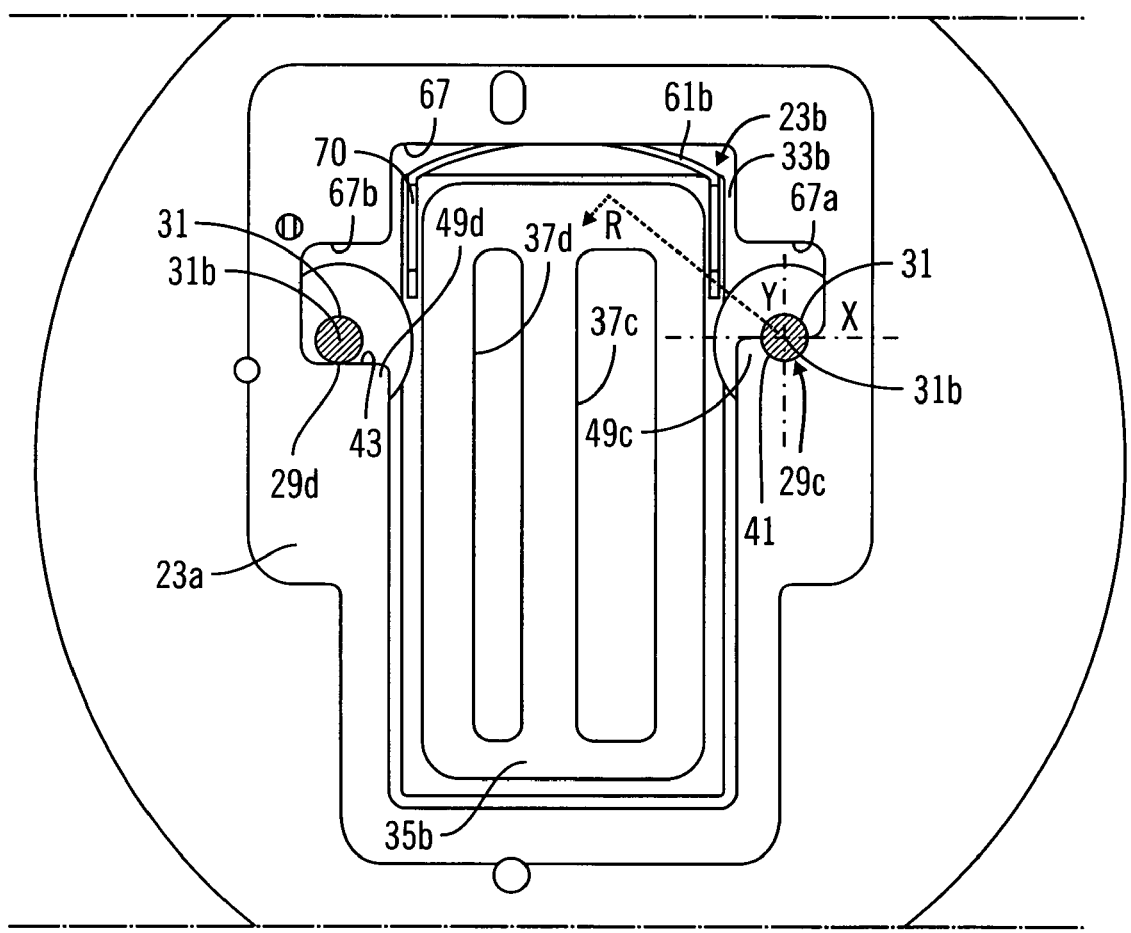
FIG. 5 shows a cross-sectional view of the kinematic electrode mount of FIG. 3.

In a fashion similar to that of the electrode 21, the retainer grooves of the kinematic alignment pins 29c, 29d receive tongue portions 49c, 49d (FIG. 3) of the support frame component 23a to secure the insert member plate portion 33b to the support frame component 23a in the z direction of FIG. 2. However, rather than using an additional pin such as the pin 51, the insert member plate portion 33b has a retainer tab 69 which receives a tongue portion 49e of the support frame component 23a to further secure the insert member plate portion 33b to the support frame component 23a in the z direction of FIG. 2. The insert member component 23b has a spring 61b (FIGS. 2, 3) which engages the support frame component 23a to prevent accidental displacement of the insert member component 23b from the kinematic engagement positions. As best seen in FIG. 5, the spring 61b has ends received in apertures 70 of the insert member 23a to position the spring 61b to bias the insert member component 23b in the retained position.

It is appreciated that by locating the kinematic alignment grooves 41 and kinematic alignment surfaces 43 in known positions on the electrode support frames 21a, 23a, and by locating the kinematic alignment pins 29a, 29b, 29c, 29d in known positions of the insert member components 21a, 23b, the extraction electrode apertures 37a, 37b, 37c, 37d may be kinematically aligned with respect to the electrode support frames without the use of separate alignment tools. Moreover, the use of time consuming fasteners such as screws to fasten the insert member components 21b, 23b to the support frame components 21a, 23a may be eliminated if desired.

In the illustrated embodiment, the support frame components 21a, 23a and the insert member components 21b, 23b are each fabricated as integral, one-piece member components. Thus, for example, the kinematic alignment pins 29c, 29d, the insert member plate portion 33b, and the extraction electrode body portion 3b of the insert member component 23b are fabricated integrally into a one-piece member. Each component may be fabricated as a cast member in a mold and machined to the final dimensions, or may be fabricated as separate parts and welded, brazed or otherwise combined together into the desired component. It is appreciated that each component may also be fabricated from separate parts fastened together. However, it is believed that an integral, one-piece construction of each component may facilitate placement of the kinematic surfaces in the appropriate locations.

As previously mentioned, the kinematic mounting arrangement of the illustrated embodiments may be applied to ion implanter electrodes other than extraction electrodes. For example, the ion selector 7 of the illustrated embodiment, comprises a series of discrete elements which are spaced apart along the beam and define a series of apertures which, in combination, select ions of the correct mass and charge state to be implanted in the target substrate while rejecting other spatially resolved ions which pass through the analyzing magnet 5. In this particular embodiment, the ion selector 7 comprises a plate electrode which rejects most of the unwanted ion species exiting from the magnet, a pair of elements which together define a variable width mass resolving slit which passes only the selected ion specie, and a further element which defines the height of the ion beam. However, the number of mass resolving elements and their configuration may be varied.

The ion selector assembly is housed in a chamber which forms part of the flight tube and which is disposed between the magnet and the electrode assembly 9. The flight tube including the mass resolving chamber provides the means by which the beam is transported from the ion beam generator to the electrode assembly 9. The mass resolving chamber wall comprises a part which extends in the direction of the beamline and defines a generally cylindrical envelope, and a transverse part adjacent the cylindrical part which constitutes a plate electrode disposed transverse to the beam line and defines an aperture through which the beam can pass, the aperture being adjacent to the final element of the ion selector 7. The transverse part provides an electrostatic screen for screening the ion selector 7 from electric fields originating downstream of the ion selector. The kinematic mounting techniques described herein may be applied to one or more of the plate electrodes of an ion selector of an ion implanter.

A screening assembly is positioned between the exit aperture of the mass resolving chamber and the electrode assembly 9 to reduce penetration of the electric field from the electrode assembly 9 into the mass resolving chamber through the exit aperture. The screening assembly comprises a cylindrical electrode, and a field defining electrode. The cylindrical electrode is arranged coaxially with the exit aperture of the mass resolving chamber and with one end positioned adjacent and connected to the transverse part (or downstream end) of the mass resolving chamber wall. The cylindrical electrode extends downstream of the mass resolving chamber and may have an inwardly extending radial flange formed at its downstream end to provide additional screening and to allow the fitting of the first electrode of the deceleration lens.

The field defining electrode, which may or may not be used, comprises a circular plate with an aperture formed in the center thereof. The field defining electrode is mounted within and supported by the cylindrical electrode and is positioned about midway between the ends of the cylindrical electrode (although this may vary) and transverse to beam line axis. The aperture may be elliptical, rectangular or square and, in one embodiment may taper gently outwards towards the electrode assembly 9. In this example, the aperture is square. The cylindrical electrode and the field defining electrode may each be made of graphite or other suitable material. The kinematic mounting techniques described herein may be applied to the electrodes of a screening assembly of an ion implanter.

The electrode assembly 9 for controlling the implant energy of the ion beam is situated just beyond the screening assembly, and comprises a field or ring electrode and an apertured plate electrode. The field electrode, has a generally circular symmetry and defines an aperture adjacent and substantially coaxial with the exit aperture of the screening assembly. The plate electrode is disposed generally transverse to the beam and defines a further aperture through which the ion beam can pass, this further aperture being disposed adjacent the field electrode aperture. The field electrode and the plate electrode may each be made of graphite or other suitable material. The kinematic mounting techniques described herein may be applied to the electrodes of an ion selector for controlling implant energy.

In this embodiment, the plasma generator 13 comprises a plasma flood system which introduces low energy electrons into the ion beam near the target. The plasma flood system includes a guide or confinement tube through which the ion beam can pass from the plate electrode aperture to the target substrate 12, and which both maintains electrons from the plasma flood system in the vicinity of the ion beam and screens the portion of the ion beam between the plate electrode aperture and the wafer from stray electric fields. An apertured plate electrode is positioned at the upstream end of the confinement tube, adjacent the apertured plate electrode of the deceleration assembly to provide additional screening of the interior of the confinement tube from electric fields from the field electrode. The kinematic mounting techniques described herein may be applied to the electrodes of an electron injector of an ion implanter. The kinematic mounting techniques described herein may be applied to the electrodes of a plasma flood system of an ion implanter.

The ion implanter further comprises an ion source voltage supply for biasing the ion source, a suppression electrode voltage supply for biasing the suppression electrode, a flight tube voltage supply for biasing the flight tube, the mass resolving chamber, the screening assembly, and the appropriate electrodes of the extraction assembly. A field electrode voltage supply biases the electrodes of the electrode assembly 9. A plasma flood voltage supply biases the electron confining electrode and the apertured screening plate electrode. In this embodiment, the apertured plate electrode of the deceleration lens, the target substrate holder 11 and the substrate 12 are maintained at ground potential, which facilitates handling of the target substrate, simplifies the target support assembly, and serves as a convenient reference potential for the other electrodes.

A vacuum port is formed in the chamber wall near the analyzing magnet 5 which is connected to a vacuum pump for evacuating the chamber. The vacuum port as well as other features discussed above, may be omitted, depending upon the particular application.

Figure 8:
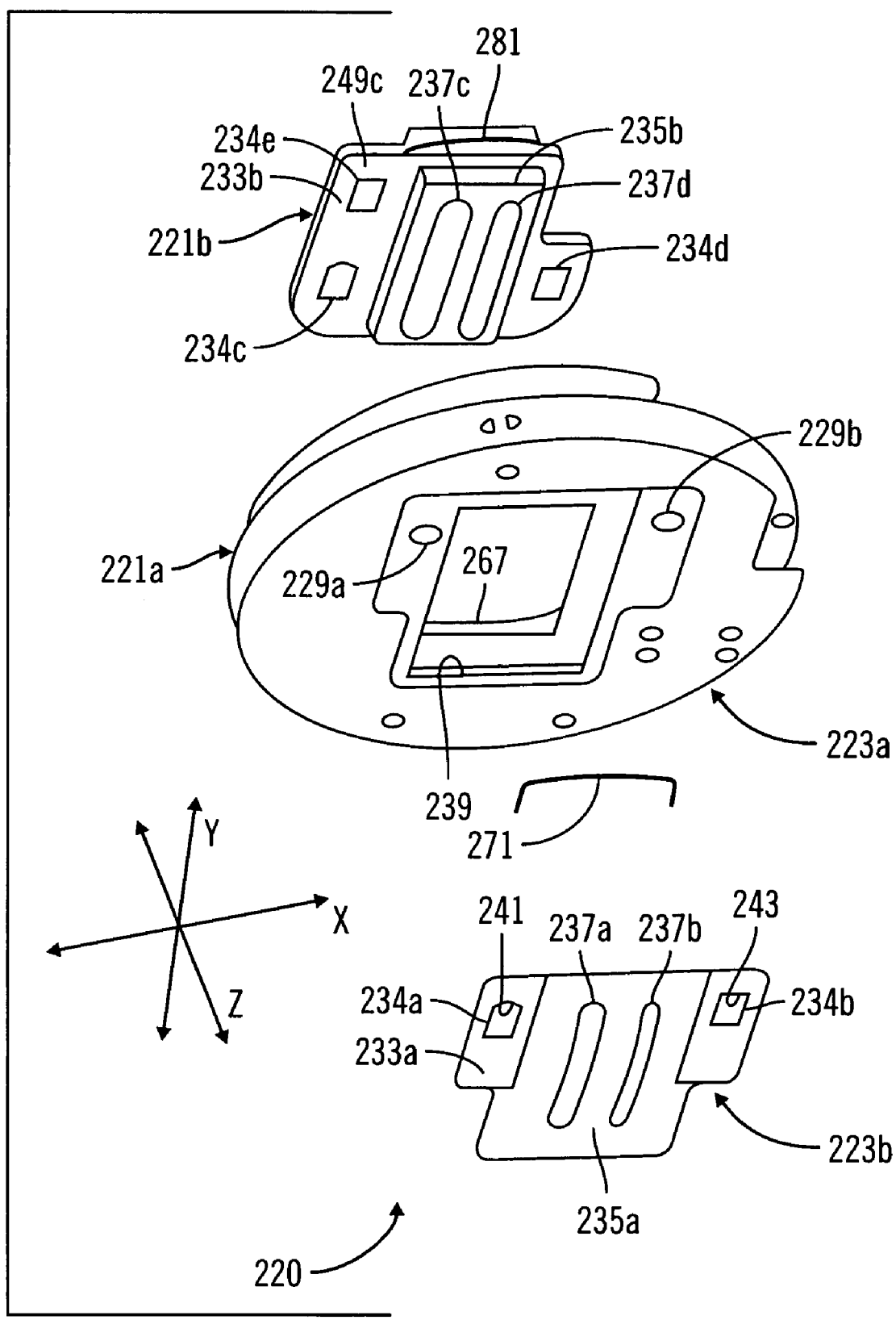
FIG. 8 shows an exploded view of kinematic electrode mounts in accordance with alternative embodiments.
Figure 9:
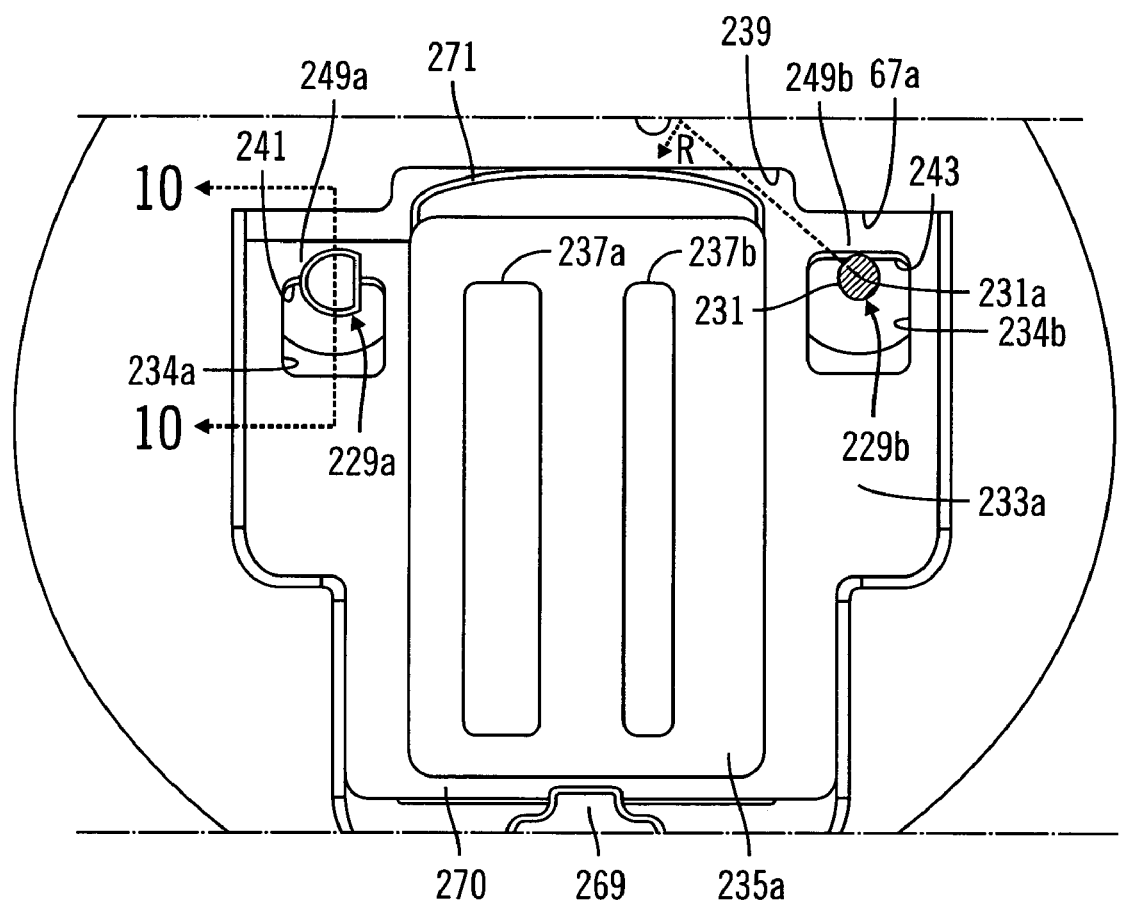
FIG. 9 shows a plan view of one embodiment of a kinematic electrode mount of FIG. 8.

In the embodiments described above, the alignment pins 29a–29d and retainer caps 45 are a part of the insert member components 21b, 23b and the alignment grooves 41, alignment surfaces 43 and tongue portions 49a–49e are part of the support plate components 21a, 23a. It is appreciated that these alignment and retention elements may be placed upon different components, depending upon the application. For example, FIG. 8 shows a partially unassembled extraction electrode assembly 220. Like the embodiment, of FIG. 2, one extractor electrode includes an electrically conductive mounting or support frame component 221a and an electrically conductive insert member component 221b which is inserted into and mounted to the support frame component 221a. In a similar fashion, another extraction electrode includes a support frame component 223a and an insert member component 223b which is inserted into and mounted to the support frame component 223a. In accordance with another aspect of the illustrated embodiments, each support frame component 221b, 223b has a plurality of kinematic alignment pins such as the alignment pins 229a, 229b of support frame component 223a shown in FIGS. 8 and 9. As best seen in the cross-sectional assembly drawing of FIG. 9, the kinematic alignment pins 229a and 229b of the insert member component 221b each have a generally cylindrical body portion 231. In a similar manner, the kinematic alignment pins of the support frame component 221a each have a generally cylindrical body portion.

The insert member component 223b has a plate portion 233a which defines alignment slots 234a, 234b. Extending from the plate portion 233a is an extraction electrode body portion 235a which defines a pair of ion beam extraction slots 237a, 237b. When mounted to the support frame component 221a, the extraction electrode body portion 235a extends through a central aperture 239 of the support frame component 221a. Similarly, the insert member component 221b has a plate portion 233b which defines alignment slots 234c, 234d through which the kinematic alignment pins of the support frame component 221a extend. Also extending from the plate portion 233b is an extraction electrode body portion 235b which defines a pair of ion beam extraction slots 237c, 237d. When mounted to the support frame component 221a, the extraction electrode body portion 235b extends through a central aperture 267 of the support frame component 221a.

Figure 10:
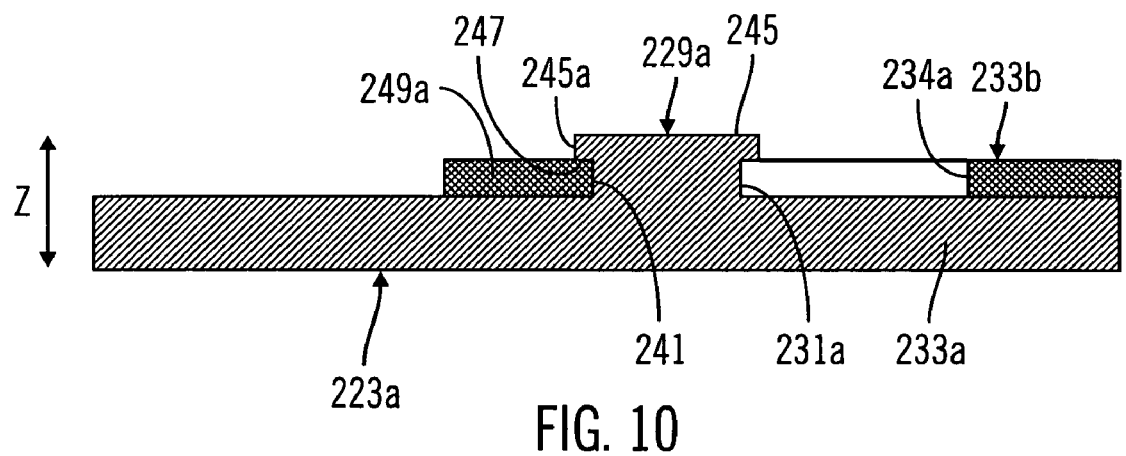
FIG. 10 is a cross-sectional view of an alignment slot of the kinematic electrode mount of FIG. 9 as shown along the lines 10—10 of FIG. 9.

The support frame components 221a and 223a may be aligned and mounted within the ion implanter in a manner similar to that described above in connection with support frame components 21a and 23a. To kinematically mount the insert member component 223b into a support frame component 223a which has previously been aligned using an alignment tool as described above in connection with the support frame component 21a, the kinematic alignment pin 229a of the support frame component 223b is received in a kinematic groove 241 (FIGS. 9, 10) defined by a base surface of the slot 234a of the insert member component 223a. When the outer cylindrical surface 231a of the kinematic alignment pin 229a is fully engaged with the surfaces of the kinematic groove 241, the center axis of the pin 229a is precisely located in two orthogonal directions relative to the support frame component 223a in a manner similar to that described above in connection with the support frame component 23a of FIG. 5.

The insert member component 223b may be rotated until the flat kinematic alignment surface 243 (FIG. 9) defined by a base surface of the slot 234b of the insert member component 223b engages the outer cylindrical surface 231 of the kinematic alignment pin 229b. In this position, the center axis 231a of the kinematic alignment pin 229b is precisely located in a rotational direction relative to the support frame component 223a in a manner similar to that described above in connection with the support frame component 23a of FIG. 5.

In a fashion similar to that of the electrode 23, the retainer grooves 247 of the kinematic alignment pins 229a, 229b receive tongue portions 249a (FIG. 10), 249b (FIG. 9) of the insert member component 223b. The inner retention surfaces of the grooves 247 engage the outer retention surfaces of the tongue portions 249a to secure the insert member plate portion 233a to the support frame component 223a in the z direction of FIG. 10. The support frame component 223a has a retainer tab 269 which receives a tongue portion 270 of the insert member component 223b to further secure the insert member plate portion 233a to the support frame component 223a in the z direction of FIG. 10. The insert member component 223b has a spring 271 (FIGS. 8, 9) which engages the support frame component 223a to prevent accidental displacement of the insert member component 223b from the kinematic engagement positions.

The insert member component 221b is kinematically mounted into a previously aligned support frame component 221a in a manner similar to that described above in connection with the insert member component 223b and support frame component 223a wherein kinematic alignment pins are inserted into and engaged with the kinematic alignment surfaces of the slots 234c and 234d. However, rather than a retainer tab, the support member component 221a has an additional pin to form a retainer groove which receives a tongue portion 249c (FIG. 8) of the insert member component 221b in a manner similar to that described above in connection with the insert member 21b and support frame component 21a. The insert member component 221b has a spring 281 (FIG. 8) which engages the support frame component 221a to prevent accidental displacement of the insert member component 221b from the kinematic engagement positions.

The foregoing description of various embodiments of the invention has been presented for the purposes of illustration and description. It is not intended to be exhaustive or to limit the invention to the precise form disclosed. Many modifications and variations are possible in light of the above teaching. For example, it is appreciated that the shapes and sizes of the various alignment and retention surfaces may vary, depending upon the application. It is intended that the scope of the invention not be limited by this detailed description.

What is claimed is:

1. An ion implanter electrode component for use in an ion implanter having an electrode which includes an electrically conductive electrode support frame, and adapted to generate an ion beam, comprising:

an electrically conductive insert member adapted to be inserted into said ion implanter support frame installed in said ion implanter, said insert member comprising an electrode body portion defining an aperture, said insert member further comprising a plurality of alignment pins positioned to engage said ion implanter support frame and to align said aperture in an aligned position relative to said ion implanter support frame wherein said electrode body portion is positioned to receive said ion beam passing through said aperture, said insert member further comprising a plurality of retention flanges adapted to engage said ion implanter support frame and to retain said electrode body portion in said aligned position within said ion implanter support frame and electrically coupled to said support frame during said ion beam generation.

2. The component of claim 1 wherein each alignment pin has a cylindrical pin body portion which defines a cylindrical outer surface adapted to engage said ion implanter support frame.

3. The component of claim 1 wherein each alignment pin has a pin body portion which defines an outer surface adapted to engage said ion implanter support frame, and a retention cap having a width wider than the width of said pin body portion wherein each alignment pin retention cap defines a retention flange.

4. The component of claim 1 wherein the alignment pins, retention flanges and the electrode body portion are integrally formed wherein the insert member is a one-piece member.

5. The component of claim 1 wherein said support frame has a flat face portion and said insert member has a flat face portion and wherein said insert member flat face portion is positioned engaged face to face with said support frame flat face portion in said aligned and retained position.

6. An ion implanter electrode for use in an ion implanter adapted to generate an ion beam, comprising:
an electrically conductive electrode support frame which defines an aperture having first and second alignment surfaces wherein said first alignment surface is groove-shaped; and
an electrically conductive insert member adapted to be inserted into said ion implanter support frame, said insert member comprising an electrode body portion defining an aperture and adapted to be inserted into said support frame aperture, said insert member further comprising a first alignment pin positioned to engage said ion implanter support frame groove-shaped first alignment surface and a second alignment pin position to engage said ion implanter support frame second alignment surface to align said aperture in an aligned position relative to said ion implanter support frame wherein said electrode body portion is positioned to receive said ion beam passing through said aperture, said insert member further comprising a plurality of retention flanges adapted to engage said ion implanter support frame and to retain said electrode body portion in said aligned position within said ion implanter support frame and electrically coupled to said support frame.

7. The electrode of claim 6 wherein each alignment pin has a cylindrical body portion which defines a cylindrical outer surface adapted to engage said ion implanter support frame.

8. The electrode of claim 6 wherein each alignment pin has a body portion which defines an outer surface adapted to engage said ion implanter support frame, and a retention cap having a width wider than the width of said pin body portion wherein each alignment pin retention cap defines a retention flange.

9. The electrode of claim 6 wherein the alignment pins, retention flanges and the electrode body portion are integrally formed so that the insert member is a one-piece member.

10. The electrode of claim 6 wherein said support frame has a flat face portion and said insert member has a flat face portion and wherein said insert member flat face portion is positioned engaged face to face with said support frame flat face portion in said aligned and retained position.

11. The electrode of claim 6 further comprising a spring positioned between said insert member and said support frame to bias said insert member in said aligned and retained position.

12. A method of assembling an ion implanter electrode for use in an ion implanter adapted to generate an ion beam, comprising:
inserting an electrically conductive insert member into an electrically conductive electrode support frame which defines an aperture having first and second alignment surfaces wherein said first alignment surface is groove-shaped, wherein said insert member comprises an electrode body portion defining an aperture;
engaging a first alignment pin of said insert member with said ion implanter support frame groove-shaped first alignment surface;
engaging a second alignment pin of said insert member with said ion implanter support frame second alignment surface to align said insert member aperture in an aligned position relative to said ion implanter support frame wherein said electrode body portion is positioned to receive said ion beam passing through said aperture; and
engaging a plurality of retention flanges of said insert member with said ion implanter support frame to retain said electrode body portion in said aligned position relative to said ion implanter support frame and electrically coupled to said support frame.

13. The method of claim 12 wherein each alignment pin has a cylindrical body portion which defines a cylindrical outer surface adapted to engage an alignment surface of said ion implanter support frame.

14. The method of claim 12 wherein each alignment pin has a body portion which defines an outer surface adapted to engage an alignment surface of said ion implanter support frame, and a retention cap having a width wider than the width of said pin body portion wherein each alignment pin retention cap defines a retention flange.

15. The method of claim 12 wherein the alignment pins, retention flanges and the electrode body portion are integrally formed so that the insert member is a one-piece member.

16. The method of claim 12 wherein said inserting includes engaging an insert member flat face portion face to face with a support frame flat face portion.

17. The method of claim 12 further comprising positioning a spring between said insert member and said support frame to bias said insert member in said aligned and retained position.

18. An ion extraction electrode component for use in an ion implanter having an electrode which includes an electrically conductive electrode support frame, and adapted to generate an ion beam, comprising:
a one-piece electrically conductive insert member adapted to be inserted into said ion implanter support frame installed in said ion implanter, said insert member comprising an integral electrode body portion defining an aperture, said insert member further comprising a plurality of integral alignment pins wherein each alignment pin has a cylindrical pin body portion which defines a cylindrical outer surface adapted to engage said ion implanter support frame and to align said aperture in an aligned position relative to said ion implanter support frame wherein said electrode body portion is positioned to receive said ion beam passing through said aperture, wherein each alignment pin further has a retention cap having a width wider than the width of said pin body portion wherein each alignment pin retention cap defines a retention flange adapted to engage said ion implanter support frame and to retain said electrode body portion in said aligned position within said ion implanter support frame and electrically coupled to said support frame during said ion beam generation, and wherein said support frame has a flat face portion and said insert member has a flat face portion and wherein said insert member flat face portion is positioned engaged face to face with said support frame flat face portion in said aligned and retained position.

19. An ion implanter electrode component for use in an ion implanter having an electrode which includes an electrically conductive electrode support frame having alignment pins and retention flanges, and adapted to generate an ion beam, comprising:

an electrically conductive insert member adapted to be inserted into said ion implanter support frame installed in said ion implanter, said insert member comprising an electrode body portion defining an aperture, said insert member defining a plurality of alignment slots, each alignment slot having a base surface which defines an alignment surface adapted to be engaged by a support frame alignment pin to align said insert member aperture in an aligned position relative to said ion implanter support frame wherein said electrode body portion is positioned to receive said ion beam passing through said insert member aperture, said insert member further comprising a plurality of retention surfaces, each retention surface being adapted to be engaged by said ion implanter support frame retention flanges to retain said electrode body portion in said aligned position within said ion implanter support frame and electrically coupled to said support frame during said ion beam generation.

20. The component of claim 19 wherein each alignment pin has a cylindrical pin body portion which defines a cylindrical outer surface adapted to engage said ion implanter insert member alignment slot base surface.

21. The component of claim 19 wherein each alignment pin has a pin body portion which defines an outer surface adapted to engage said ion implanter insert member alignment slot base surface, and a retention cap having a width wider than the width of said pin body portion wherein each alignment pin retention cap defines a retention flange.

22. The component of claim 19 wherein the component is made of graphite.

23. The component of claim 19 wherein said support frame has a flat face portion and said insert member has a flat face portion and wherein said insert member flat face portion is positioned engaged face to face with said support frame flat face portion in said aligned and retained position.

24. An ion implanter electrode for use in an ion implanter adapted to generate an ion beam, comprising:

an electrically conductive electrode support frame which defines an aperture; and an electrically conductive insert member adapted to be inserted into said ion implanter support frame, said insert member comprising an electrode body portion defining an aperture and adapted to be inserted into said support frame aperture, said insert member further comprising first and second alignment surfaces of which said first alignment surface is groove-shaped;

wherein said support frame further comprises a first alignment pin positioned to engage said ion implanter insert member groove-shaped first alignment surface and a second alignment pin position to engage said ion implanter insert member second alignment surface to align said insert member aperture in an aligned position relative to said ion implanter support frame wherein said electrode body portion is positioned to receive said ion beam passing through said aperture, said insert member further comprising a plurality of retention flanges adapted to engage said ion implanter support frame and to retain said electrode body portion in said aligned position within said ion implanter support frame and electrically coupled to said support frame.

25. The electrode of claim 24 wherein each alignment pin has a cylindrical body portion which defines a cylindrical outer surface adapted to engage said ion implanter insert member.

26. The electrode of claim 24 wherein each alignment pin has a body portion which defines an outer surface adapted to engage said ion implanter insert member, and a retention cap having a width wider than the width of said pin body portion wherein each alignment pin retention cap defines a retention flange.

27. The electrode of claim 24 wherein the alignment pins, retention flanges and the electrode body portion are integrally formed so that the support frame is a one-piece member.

28. The electrode of claim 24 wherein said support frame has a flat face portion and said insert member has a flat face portion and wherein said insert member flat face portion is positioned engaged face to face with said support frame flat face portion in said aligned and retained position.

29. The electrode of claim 24 further comprising a spring positioned between said insert member and said support frame to bias said insert member in said aligned and retained position.

30. A method of assembling an ion implanter electrode for use in an ion implanter adapted to generate an ion beam, comprising:

inserting an electrically conductive insert member into an electrically conductive electrode support frame having an aperture wherein said insert member comprises an electrode body portion defining an aperture;

engaging with a first groove-shaped alignment surface of said insert member with a first alignment pin of said support frame;

engaging a second alignment surface of said insert member with a second alignment pin of said support frame to align said insert member aperture in an aligned position relative to said ion implanter support frame wherein said electrode body portion is positioned to receive said ion beam passing through said insert member aperture; and engaging a plurality of retention flanges of said support frame with said ion implanter insert member to retain said electrode body portion in said aligned position relative to said ion implanter support frame and electrically coupled to said support frame.

31. The method of claim 30 wherein each alignment pin has a cylindrical body portion which defines a cylindrical outer surface adapted to engage an alignment surface of said ion implanter insert member.

32. The method of claim 30 wherein each alignment pin has a body portion which defines an outer surface adapted to engage an alignment surface of said ion implanter insert member, and a retention cap having a width wider than the width of said pin body portion wherein each alignment pin retention cap defines a retention flange.

33. The method of claim 30 wherein the alignment pins, retention flanges and the electrode body portion are integrally formed so that the support frame is a one-piece member.

34. The method of claim 30 wherein said inserting includes engaging an insert member flat face portion face to face with a support frame flat face portion.

35. The method of claim 30 further comprising positioning a spring between said insert member and said support frame to bias said insert member in said aligned and retained position.

36. An ion extraction electrode component for use in an ion implanter having an electrode which includes an electrically conductive electrode support frame having round alignment pins, and adapted to generate an ion beam, comprising:

a one-piece electrically conductive insert member adapted to be inserted into said ion implanter support frame installed in said ion implanter, said insert member comprising an integral electrode body portion defining an aperture, said insert member further defining a plurality of rectangular alignment slots, each alignment slot having a base surface which defines an alignment surface adapted to be engaged by a support frame alignment pin to align said insert member aperture in an aligned position relative to said ion implanter support frame during said ion beam generation, wherein one base alignment surface is groove-shaped.

* * * * *